US005448156A

United States Patent [19]

Tsay

[11] Patent Number: 5,448,156

[45] Date of Patent: Sep. 5, 1995

[54] LOW POWER VOLTAGE REGULATOR

[75] Inventor: Ching-Yuh Tsay, Richardson, Tex.

[73] Assignee: Texas Instruments Incorporated, Dallas, Tex.

[21] Appl. No.: 116,384

[22] Filed: Sep. 2, 1993

[51] Int. Cl.[6] .......................... G05F 3/04; H03K 3/01

[52] U.S. Cl. ..................................... 323/312; 327/541

[58] Field of Search ............... 323/272, 274, 275, 280, 323/281, 284, 315, 349, 312; 307/296.1, 296.3, 296.6

[56] References Cited

U.S. PATENT DOCUMENTS

| | | | |
|---|---|---|---|
| 3,579,089 | 5/1971 | Giess | 323/22 |
| 4,897,596 | 1/1990 | Hughes et al. | 323/315 |
| 5,027,053 | 6/1991 | Ohri et al. | 307/296.8 |
| 5,187,429 | 2/1993 | Phillips | 323/315 |
| 5,189,316 | 2/1993 | Murakami et al. | 307/296.1 |

OTHER PUBLICATIONS

Yoshinobu Nakagonme, et al, Circuit Techniques for 1.5–3.6 V Battery-Operated 64–Mb DRAM, *IEEE Journal of Solid State Circuits,* vol. 26, No. 7, Jul. 1991

*Primary Examiner*—Thomas M. Dougherty
*Assistant Examiner*—Matthew V. Nguyen
*Attorney, Agent, or Firm*—Robert N. Rountree; Richard B. Havill; Richard l. Donaldson

[57] ABSTRACT

A circuit is designed for regulating a power supply voltage. A regulator circuit (26) compares a power supply sample voltage $VAR_1$ (34) and a reference voltage VREF (20) and corrects the power supply voltage $VAR_0$ (30). The regulator circuit rate for correcting the power supply voltage varies with the regulator circuit power consumption. A circuit (160), responsive to a control signal (164), changes the regulator circuit power consumption.

14 Claims, 4 Drawing Sheets

LOW POWER VOLTAGE REGULATOR

FIELD OF THE INVENTION

This invention relates to integrated circuits and more particularly to power supply regulator circuits.

BACKGROUND OF THE INVENTION

Present complementary metal oxide semiconductor (CMOS) dynamic random access memory (DRAM) circuits are frequently used for main memory in a variety of system applications, e.g., laptop and notebook computer systems which are battery powered. These battery powered applications impose practical limitations such as speed, power, feature size, and reliability on dynamic random access memory design. Optimal performance of a system depends on an effective balance of these factors in the design. Current dynamic random access memory designs minimize operating voltage to maximize reliability as feature sizes and oxide thicknesses decrease.

A reduction in operating voltage effectively reduces power consumption and is beneficial to many aspects of dynamic random access memory reliability. It is constrained, however, by desired operating speed, a function of internal operating voltage, and a need for compatibility with the operating voltage of existing system applications. An on-chip voltage regulator can reduce dynamic random access memory internal operating voltage and thereby maximize reliability. It also maintains compatibility with the operating voltage of existing system applications. An additional benefit of an on-chip voltage regulator is that it can maintain a stable internal chip voltage over relatively large variations of an external voltage. Even though dynamic random access memory may be subjected to relatively large variations of external voltage, internal voltage changes are minimized and operating speed will remain stable.

An effective on-chip voltage regulator responds to a variation in circuit load requirements so that circuit operation and speed are not compromised. Additionally, power consumption of the voltage regulator should be minimized so that such power consumption does not overcome other advantages of on-chip voltage regulation. Thus, good voltage regulator design becomes increasingly difficult with greater variation in circuit load requirements. This is particularly true in a dynamic random access memory where an on-chip regulator may be required to maintain a relatively constant internal voltage while variations in peak load current exceed three orders of magnitude.

A major component of power consumption in a dynamic random access memory is due to charging bitline capacitance during a read or refresh cycle. A typical dynamic random access memory read operation destructively reads a datum from a memory cell then restores the datum. A 4 MB (4,194,304 memory cells) dynamic random access memory that is completely refreshed by a cycle of 1K (1024) addresses simultaneously reads about 4K (4096) memory cells for each of the 1K addresses. Each of the memory cells from which the datum is simultaneously read is connected to a different bitline and sense amplifier. Thus, 4K sense amplifiers are simultaneously activated to amplify or sense small signals produced by the memory cells. Each sense amplifier drives one of two complementary bitlines from a bitline reference voltage to the potential of the internal power supply. The other complementary bitline is driven to ground. Peak load current may increase from less than 100 μA prior to sensing to greater than 100 mA when the 4K sense amplifiers are simultaneously activated during sensing.

Conflicting issues of power supply regulator power consumption and stable power supply regulation for wide variations in circuit load requirements are discussed in Yoshinobu Nakagome et al, Circuit Techniques for 1.5–3.6 V Battery-Operated 64-Mb DRAM, IEEE Journal of Solid State Circuits, vol. 26, No. 7, 1003, 1007 (1991). Their voltage down converter (VDC) consists of a current-mirror differential amplifier, an output stage, and a voltage switch (SW). "[T]he VDC is enabled when $V_{cc}>1.65$ V . . . and the SW is enabled when $V_{cc}<1.65$ V." Nakagome et al give two reasons "why the SW circuit is used in the low operating voltage region." First, the "driving capability of Q8 is comparatively low when $V_{cc}$ is decreased." The SW circuit provides more drive than the output stage for the differential amplifier because "[t]he gate width of Q9 is about three times larger than Q8." Second, the SW circuit saves "operating power of the VDC when the supply voltage is low and VCC can be directly applied."

There are two notable concerns with the teaching of Nakagone et al. First, the gate width of output drive transistor Q8 affects the response time of the current-mirror differential amplifier. Any increase in transistor sizes of the current-mirror differential amplifier increases power consumption. Second, the magnitude of power consumption of the VDC and, in particular, the current-mirror differential amplifier is a significant liability. Nakagone et al use the regulator for adequate response time in the high voltage operating region and accept the undesirable power consumption of the VDC circuit. In the low voltage operating region, where power consumption is less of a concern, the SW circuit is used to eliminate power consumption by the VDC.

SUMMARY OF THE INVENTION

These issues are resolved by a circuit for regulating a power supply voltage. A regulator circuit compares a power supply sample voltage and a reference voltage and corrects the power supply voltage. The regulator circuit rate for correcting the power supply voltage varies with the regulator circuit power consumption. A circuit, responsive to a control signal, changes the regulator circuit power consumption.

The present invention provides a stable, regulated voltage supply for a variety of operating modes. Comparator response time is improved by increasing comparator current during initial sensing. Power consumption is minimized by reducing comparator current after initial sensing.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
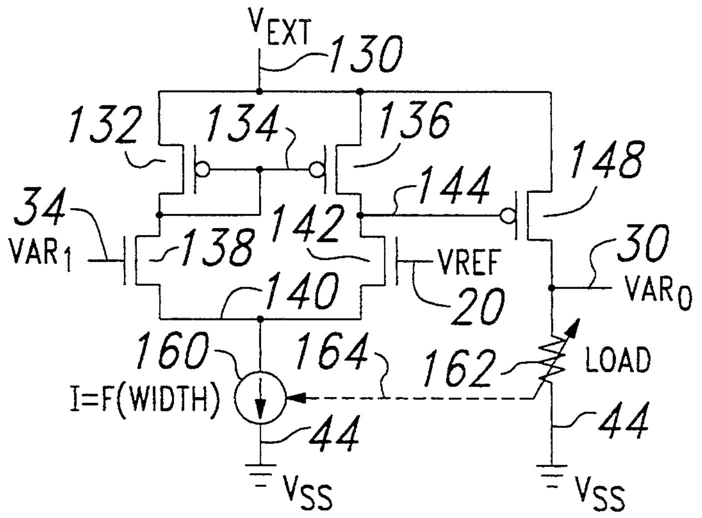
FIG. 1 is an active array regulator circuit with a variable load.

Referring now to FIG. 1, a circuit for regulating a power supply voltage will be described in detail. Transistors 132, 136, 138, 142, and current source 160 form a voltage comparator. P-channel drive transistor 148 regulates power supply voltage $VAR_0$ responsive to the comparator output at terminal 144. Gate terminals of P-channel transistors 132 and 136 are connected to the drain terminal 134 of P-channel transistor 132 in a current mirror configuration so that current through both transistors is approximately equal at the quiescent bias point of the comparator. Power supply sample voltage $VAR_1$ at terminal 34 and reference voltage VREF at terminal 20 are differential input signals for the comparator. Power supply sample voltage $VAR_1$ at terminal 34 is a sample of power supply voltage $VAR_0$. Reference voltage VREF at terminal 20 is a stable reference voltage developed by linear voltage division or another method known to those of ordinary skill in the art.

Variable load 162 represents a device powered by power supply voltage $VAR_0$. Power supply sample voltage $VAR_1$ and reference voltage VREF are approximately equal when power supply voltage $VAR_0$ is correct. The voltages at terminals 134 and 144 are approximately equal to a P-channel threshold voltage below external voltage $V_{EXT}$. P-channel drive transistor 148 is at the threshold of conduction and consumes negligible power. Thus, regulator power consumption is approximately equal to comparator power consumption when power supply voltage $VAR_0$ needs no correction.

Current source 160 establishes the quiescent bias point and the quiescent current of the comparator. Current through current source 160 is determined by total active transistor width between terminals 140 and reference supply $V_{ss}$ at terminal 44. Total power consumption of the comparator is the product of external voltage $V_{EXT}$ at terminal 130 and the current through current source 160. Simulation results (FIG. 2) show that power consumption of the comparator increases with increasing active transistor width between terminals 140 and reference supply $V_{ss}$ at terminal 44.

Figure 2:
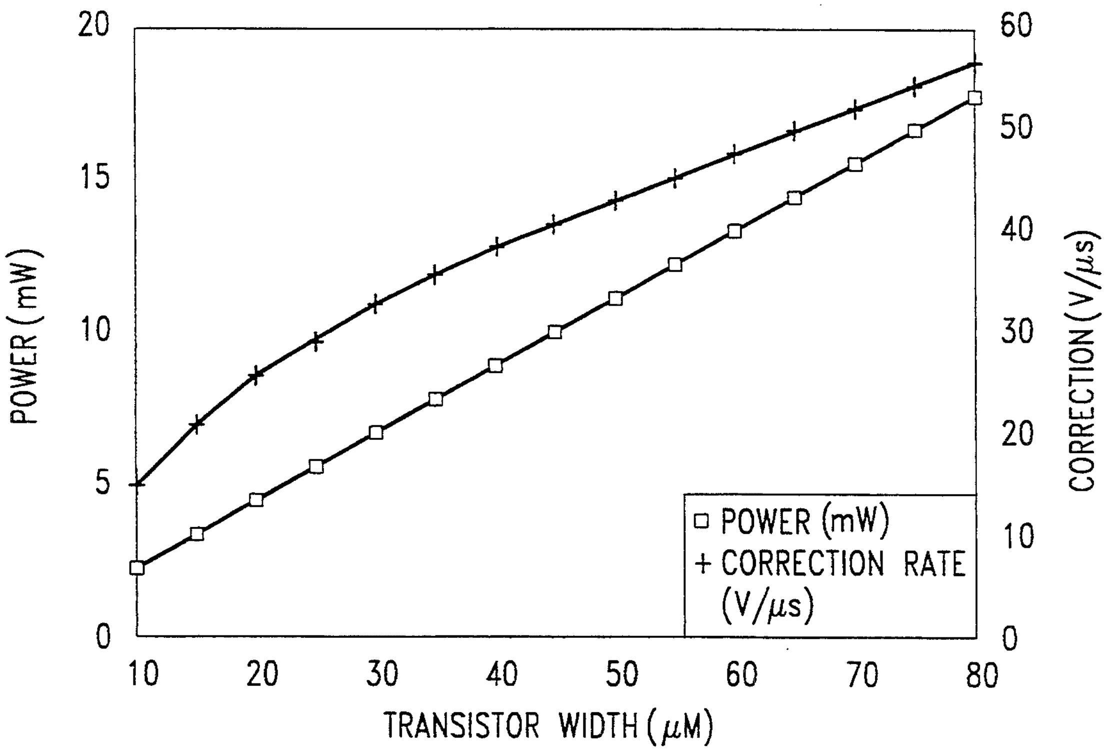
FIG. 2 is a simulation output of the circuit of FIG. 1 showing regulator power consumption and its voltage correction rate as a function of transistor width.

Control signal 164 is inactive when variable load 162 requires minimal current and power supply voltage $VAR_0$ is correct. The total active transistor width of current source 160 is 10 μm, and simulation results (FIG. 2) show that corresponding power consumption of the comparator and the power supply correction rate are 2.2 mW and 14.9 V/μs respectively. Control signal 164 goes active prior to a change in variable load 162, which would cause an abrupt increase in current from power supply voltage $VAR_0$. Control signal 164 increases the total active transistor width in current source 160 to 40 μm. This increase in total active transistor width in current source 160 increases power consumption of the comparator and the power supply correction rate to 8.7 mW and 37.4 V/μs respectively (FIG. 2). A subsequent decrease in power supply voltage $VAR_0$ causes a comparable decrease in power supply sample voltage $VAR_1$ with respect to VREF, so N-channel transistor 142 becomes more conductive than N-channel transistor 138. The difference in conductivity causes an increase in gate voltage and a corresponding decrease in conductivity of P-channel transistor 136. The decrease in conductivity of P-channel transistor 136 and corresponding increase in conductivity of N-channel transistor 142 results in a decrease in comparator output voltage at terminal 144. The decrease in voltage at terminal 144 increases the gate-to-source voltage of P-channel drive transistor 148 so that it becomes more conductive and corrects power supply voltage $VAR_0$ at a rate of 37.4 V/μs. Control signal 164 becomes inactive when current demand by variable load 162 decreases and comparator power consumption reverts to 2.2 mW. Thus, the dual advantages of low power consumption during a period of low current demand by variable load 162 and a high power supply correction rate during a period of high current demand by variable load 162 are accomplished by the regulator circuit.

Figure 3:
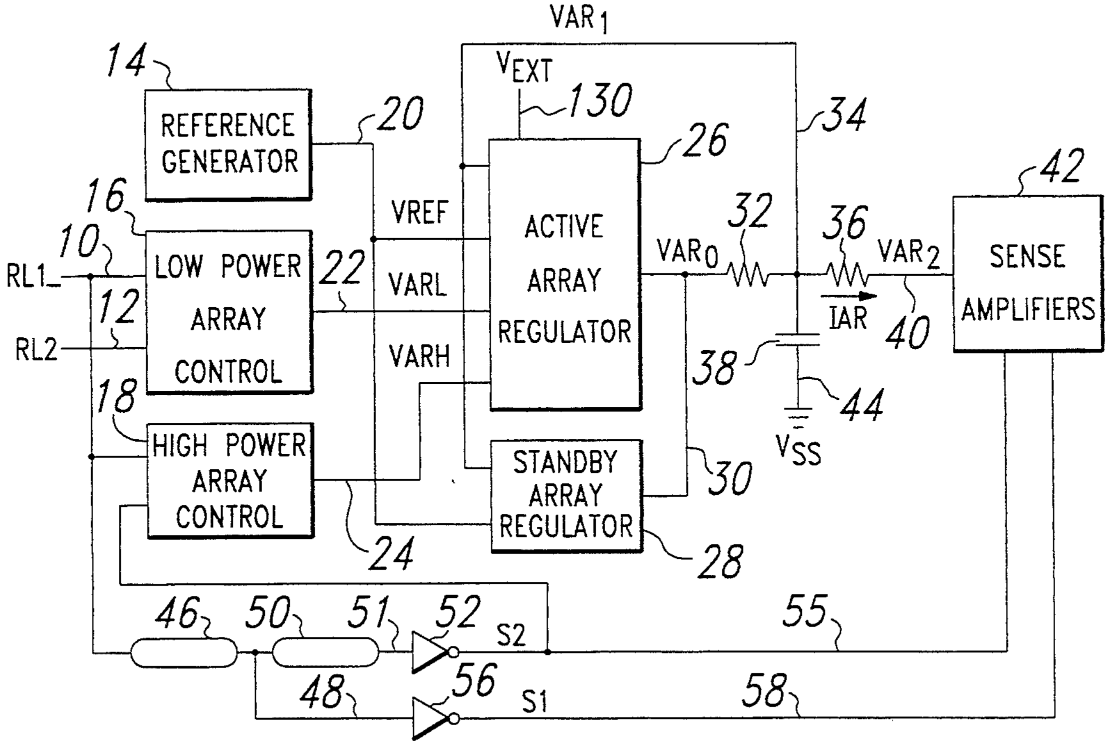
FIG. 3 is a block diagram of a power supply regulator circuit.

Referring now to FIG. 3, a circuit for regulating a power supply voltage will be described in detail with reference to the timing diagram of FIG. 4. Row logic signals RL1_ and RL2 are clock signals of a dynamic random access memory. Row logic signal RL1_ goes active (low) at the beginning of an active cycle in response to a row address strobe signal RAS_ and enables low power array control circuit 16 and high power array control circuit 18. Then row logic signal RL2 goes active (high). Array control signals VARL and VARH are output at time A (FIG. 4) by low power array control circuit 16 and high power array control circuit 18 respectively in response to row logic signal RL1_ and enable active array regulator circuit 26. Active array regulator circuit 26 power consumption and power supply correction rate are greatest when both array control signals VARL and VARH are active (high). Reference generator circuit 14 generates reference voltage VREF by linear voltage division or another method known to those of ordinary skill in the art. Reference voltage VREF and power supply sample voltage $VAR_1$ are compared by active array regulator circuit 26, and power supply voltage $VAR_0$ is corrected for any difference. Resistive element 32 couples power supply voltage $VAR_0$ to power supply sample voltage $VAR_1$. Resistive element 36 couples power supply sample voltage $VAR_1$ to power supply voltage $VAR_2$. Resistive elements 32 and 36 and capacitive element 44 may be either circuit components or parasitic elements. Power supply voltage $VAR_2$ powers a block of sense amplifiers 42. In this example, power supply sample voltage $VAR_1$ is approximately equal to power supply voltage $VAR_0$ when current through resistive elements 32 and 36 is negligible. Alternatively, power supply sample voltage $VAR_1$ and reference voltage VREF might be a fraction of power supply voltage $VAR_0$ determined by linear voltage division or other methods known to those of ordinary skill in the art.

Delay circuit 46 establishes a delay between row logic signal RL1_ and the signal at terminal 48. Each of delay circuits 46 and 50 may include a combination of logic gates or delay elements that increase elapsed time between the input and output signal transitions of the delay circuit. Inverter 56 outputs sense clock signal S1 at time B to initially activate the block of sense amplifiers 42. This initiates amplification of a difference between complementary bitline voltages VBL and VBL_ (FIG. 4). Amplification increases the load current from power supply $VAR_2$ because current into a capacitive load is proportional to the rate of change of voltage with respect to time. An increase in current IAR through the output circuit of active array regulator circuit 26 and resistive element 32 causes power supply sample voltage $VAR_1$ to decrease (FIG. 4) with respect to reference voltage VREF. Active array regulator circuit 26 corrects this difference between power supply sample voltage $VAR_1$ and reference voltage VREF by increasing power supply voltage $VAR_0$ and power supply sample voltage $VAR_1$. Active array regulator circuit 26 advantageously operates at a maximum rate of correction of power supply voltage $VAR_0$ because both array control signals VARL and VARH are active (high).

Sense clock signal S2 goes active (high) at time C after a delay established by delay circuit 50 and inverter 52 in response to the signal at terminal 48. Sense clock signal S2 at terminal 55 increases the rate of amplification by sense amplifiers 42. This increases the load current IAR from power supply voltage $VAR_2$. Power supply sample voltage $VAR_1$ decreases (FIG. 4) with respect to voltage reference VREF. Active array regulator circuit 26 corrects this difference by increasing power supply voltage $VAR_0$ and power supply sample voltage $VAR_1$. Active array regulator circuit 26 continues to operate at a maximum rate of correction of power supply voltage $VAR_0$ while array control signals VARL and VARH remain active (high).

Array control signal VARH goes inactive (low) at time D (FIG. 4) in response to sense clock signal S2 after a delay established by high power array control circuit 18. Sense amplifiers 42 now require substantially less current to complete amplification of the difference voltage on their respective bitlines. Power consumption and the rate of response to any difference between reference voltage VREF and power supply sample voltage $VAR_1$ substantially decrease in response to the transition of array control signal VARH. Array control signal VARH remains inactive (low) for the remainder of the active cycle. Thus, the power consumption by active array regulator circuit 26 is advantageously decreased for the remainder of the active cycle because only array control signal VARL remains active (high).

Row logic signal RL1_ goes inactive (high) in response to row address strobe signal RAS_. Row logic signal RL2 and sense clock signals S1 and S2 go inactive (low) in response to row logic signal RL1_. Complementary bitline voltages VBL and VBL_ are precharged to an intermediate bitline reference voltage (FIG. 4) in preparation for the next active cycle. Array control signal VARL goes inactive (low) at time E in response to row logic signal RL2 and disables active array regulator circuit 26 until the next active cycle. Output terminal 30 of standby array regulator circuit 28 is connected in common with the output of active array regulator circuit 26. Power supply voltage $VAR_0$ is maintained by standby array regulator circuit 28 until the next active cycle. Standby array regulator circuit 28 is similar to active array regulator circuit 26 in design and operation except that it always remains enabled. Transistor parameters of standby array regulator circuit 28 are modified so they are appropriate for a substantially reduced current requirement. In an alternative embodiment (not shown), standby array regulator circuit 28 is disabled in response to row logic signals RL1_ and RL2 so that it is inactive during the active cycle.

Figure 5:
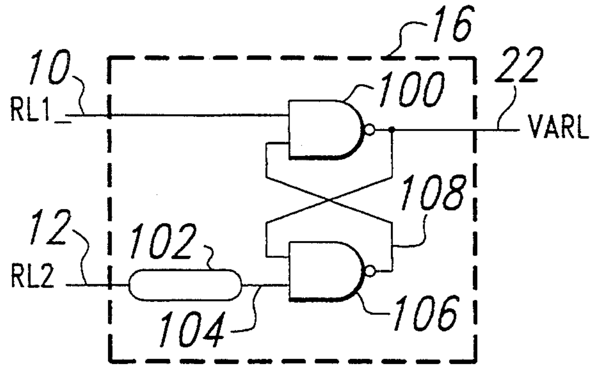
FIG. 5 is a low power array control circuit which may be used in FIG. 3.

Referring now to FIG. 5, a low power array control circuit 16 as in FIG. 3 will be described in detail. Row logic signal RL1_ goes active (low) to initiate an active cycle. This causes array control signal VARL to go unconditionally active (high). Row logic signal RL2 is inactive (low) initially so the signal at input terminal 104 of NAND gate 106 is low. Row logic signal RL2 goes active (high) in response to row logic signal RL1_. After a delay produced by delay circuit 102, the signal at input terminal 104 of NAND gate 106 goes high. High input signals at terminals 22 and 104 of NAND gate 106 produce a low output signal at terminal 108. This latches array control signal VARL in an active (high) state for the remainder of the active cycle. Row logic signal RL1_ goes inactive (high) at the end of the active cycle, but output array control signal VARL remains latched high since the signal at terminal 108 remains low. Row logic signal RL2 goes inactive (low) in response to row logic signal RL1_ at the beginning of the precharge cycle. After a delay established by delay circuit 102, the signal at input terminal 104 of NAND gate 106 goes low. This produces an unconditional high output from NAND gate 106 at terminal 108. Both input signals at terminals 10 and 108 of NAND gate 100 are then high so the latch is reset and output signal VARL goes inactive (low) until the next active cycle.

Figure 6:
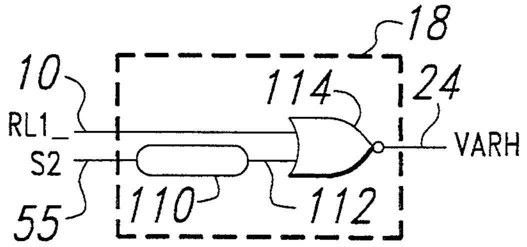
FIG. 6 is a high power array control circuit which may be used in FIG. 3.

Referring now to FIG. 6, a high power array control circuit 18 as in FIG. 3 will be described in detail. The output of NOR gate 114 produces an active (high) array control signal VARH in response to an active (low) transition of row logic signal RL1_. Array control signal VARL is also active (high) so active array regulator circuit 26 (FIG. 3) power consumption and power supply correction rate are maximized in preparation for activation of sense amplifiers 42. Sense clock signals S1 and S2 go active (high) to activate sense amplifiers 42. The transition of sense clock signal S2, delayed by delay circuit 110, produces a high signal at input terminal 112 of NOR gate 114. This causes array control signal VARH to go inactive (low) for the remainder of the active cycle. Row logic signal RL1_ goes inactive (high) at the end of the active cycle and initiates the precharge cycle. Row logic signal RL1_ also resets sense clock S2 to an inactive (low) state. Array control signal VARH remains inactive (low) until the next active cycle because row logic signal RL1_ is inactive (high).

Figure 7:
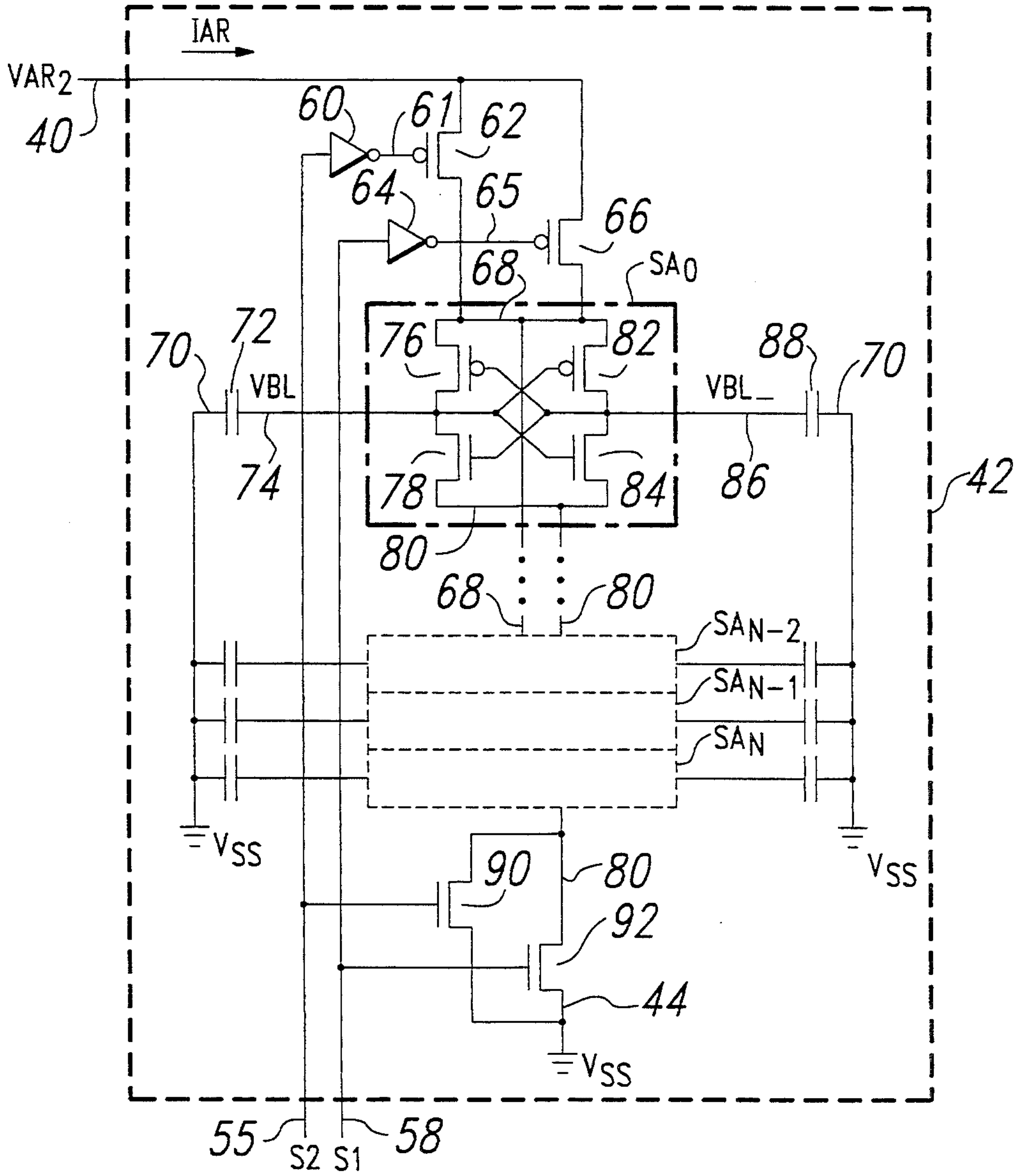
FIG. 7 is an active sense amplifier bank circuit which may be used in FIG. 3.

Referring now to FIG. 7, a block of sense amplifiers 42, as in FIG. 3, will be described in detail. Only sense amplifier $SA_0$ is shown in detail, but all others have the same configuration. Equalization circuits, storage cells, and wordlines are not shown for simplicity. Sense amplifiers $SA_0 \ldots SA_N$ are powered by power supply voltage $VAR_2$. Power supply current IAR flows into the block of sense amplifiers 42 at terminal 40. Source terminals of P-channel transistors 62 and 66 are connected to power supply voltage $VAR_2$. Drain terminals of P-channel transistors 62 and 66 are connected to a common source terminal 68 of P-channel transistors in all of the sense amplifiers designated $SA_0$ through $SA_N$. Source terminals of N-channel transistors 90 and 92 are connected to reference supply $V_{ss}$. Drain terminals of N-channel transistors 90 and 92 are connected to common source terminal 80 of N-channel transistors in all of the sense amplifiers designated $SA_0$ through $SA_N$. Input terminals of all of the sense amplifiers are equalized to an intermediate bitline reference voltage between power supply voltage $VAR_2$ and reference supply $V_{SS}$ in a precharge cycle. In an active cycle, prior to activation of sense clock S1, a difference voltage (VBL-VBL_ in FIG. 4) is established at the input terminals of the plurality of sense amplifiers by data read from a plurality of memory cells.

Operation of each of the plurality of sense amplifiers is similar, so only sense amplifier $SA_0$ will be discussed in detail. For example, input terminals 74 and 86 of sense amplifier $SA_0$ are each connected to a bitline with its respective memory cells represented by capacitors 72 and 88. The other terminals of capacitors 72 and 88 are connected to reference supply $V_{SS}$ at terminal 70. A difference voltage between bitline voltages VBL and VBL_ is established by a datum read from a selected memory cell. Sense clock signal S1 goes active (high) to initiate amplification of the difference voltage. N-channel transistor 92 turns on, and current flows from common N-channel source terminal 80 to reference supply $V_{SS}$. The output of inverter 64 at terminal 65 goes active (low) in response to sense clock signal S1. P-channel transistor 66 turns on, and current begins to flow from power supply voltage $VAR_2$ to common P-channel source terminal 68.

For the case where bitline voltage VBL is slightly positive with respect to bitline voltage VBL_ by about 100 millivolts, for example, current flowing through N-channel transistor 92 decreases the voltage at N-channel common source terminal 80. N-channel transistor 84 becomes conductive when N-channel common source terminal 80 is an N-channel threshold voltage below bitline voltage VBL and begins to discharge bitline capacitance 88. The resulting decrease in bitline voltage VBL_ decreases gate to source voltage and inhibits conduction of N-channel transistor 78. Current flowing through P-channel transistor 66 increases the voltage at P-channel common source terminal 68. P-channel transistor 76 becomes conductive when P-channel common source terminal 68 is a P-channel threshold voltage above bitline voltage VBL_ and begins to charge bitline capacitance 72. The resulting increase in bitline voltage VBL decreases gate to source voltage and inhibits conduction of P-channel transistor 82. Amplification continues in this manner as voltage at P-channel common source terminal 68 increases and voltage at N-channel common source terminal 80 decreases until sense clock signal S2 goes active (high). N-channel transistor 90 turns on in parallel with N-channel transistor 92, and increases current flow from common N-channel source terminal 80 to reference supply $V_{SS}$. The output of inverter 60 at terminal 61 goes active (low) in response to sense clock signal S2. P-channel transistor 62 turns on in parallel with P-channel transistor 66, and current flow increases from power supply voltage $VAR_2$ to common P-channel source terminal 68. Amplification continues, and power supply current IAR decreases monotonically (FIG. 4) until bitline voltage VBL is equal to power supply voltage $VAR_2$ and bitline voltage VBL_ is equal to reference supply voltage $V_{SS}$. Datum of the selected memory cell is fully restored by the amplification. The active cycle is terminated and the precharge cycle is initiated when row logic signal RL1_ goes inactive (high). Charge is trapped in the selected memory cell when its wordline (not shown) is returned to an inactive (low) state. Sense clock signals S1 and S2 go inactive (low) in response to row logic signal RL1_, and turn off N-channel transistors 90 and 92 respectively. The outputs of inverters 60 and 64 at terminals 61 and 65 go high and turn off P-channel transistors 62 and 66 respectively. Equalization circuitry (not shown) then precharges bitline voltages VBL and VBL_, at terminals 74 and 86 respectively, to an intermediate bitline reference voltage in preparation for the next active cycle.

Figure 8:
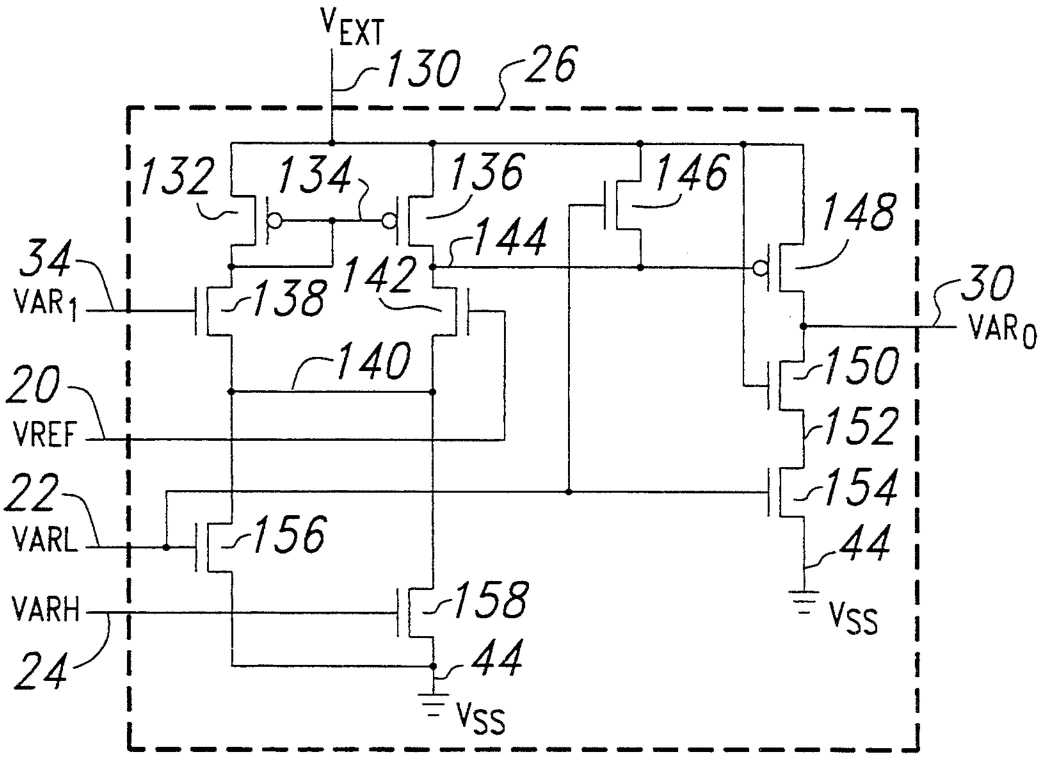
FIG. 8 is an active array regulator circuit which may be used in FIG. 3.

Referring now to FIG. 8, an example of active array regulator 26 will be described in detail. Transistors 132, 136, 138, 142, 156, and 158 form a voltage comparator. Gate terminals of P-channel transistors 132 and 136 are connected to the drain terminal 134 of P-channel transistor 132 in a current mirror configuration so that current through each of the transistors 132 and 136 is approximately equal at the quiescent bias point of the comparator. Power supply sample voltage $VAR_1$ and reference voltage VREF are differential input signals for the comparator. N-channel transistors 156 and 158 establish the quiescent bias point and the quiescent current of the comparator responsive to array control signals VARL and VARH. Array control signals VARL and VARH are both inactive (low) and the comparator is disabled during a precharge cycle. Power supply voltage $VAR_0$ is maintained by standby array regulator 28 (FIG. 3). N-channel transistors 156 and 158 are off, so no current flows through the comparator.

Transistors 146, 148, 150, and 154 form a drive circuit responsive to the voltage at comparator output terminal 144 and array control signal VARL. Array control signal VARL is inactive (low) during precharge so P-channel transistor 146 is on. P-channel transistor 146 shunts the gate and source terminals of P-channel drive transistor 148 so that it remains off during precharge. The gate terminal of N-channel transistor 150 is connected to external voltage $V_{EXT}$ so that it is on and conducts current when N-channel transistor 154 is on. N-channel transistor 150 has very little drive strength compared to P-channel drive transistor 148 and primarily functions as a resistive conductor to stabilize the drive circuit. The gate of N-channel transistor 154 is connected to array control signal VARL, so N-channel transistor 154 is off during precharge.

Active cycle operation of the active array regulator circuit begins at time A (FIG. 4) when array control signals VARL and VARH both go active (high). P-channel transistor 146 is turned off, releasing gate-to-source shunt of P-channel drive transistor 148. N-channel transistor 154 is turned on, and a small current begins to flow through N-channel transistor 150. N-channel transistors 156 and 158 are turned on and the quiescent bias point of the comparator is established. Quiescent power consumed by the comparator is determined by current that flows through N-channel transistors 156 and 158. Power supply sample voltage $VAR_1$ and reference voltage VREF are approximately equal prior to sense amplifier activation and array current IAR is negligible. The voltage at terminals 134 and 144 is approximately equal to a P-channel transistor threshold voltage below external voltage $V_{EXT}$. Thus, P-channel drive transistor 148 is at the threshold of conduction.

Figure 4:
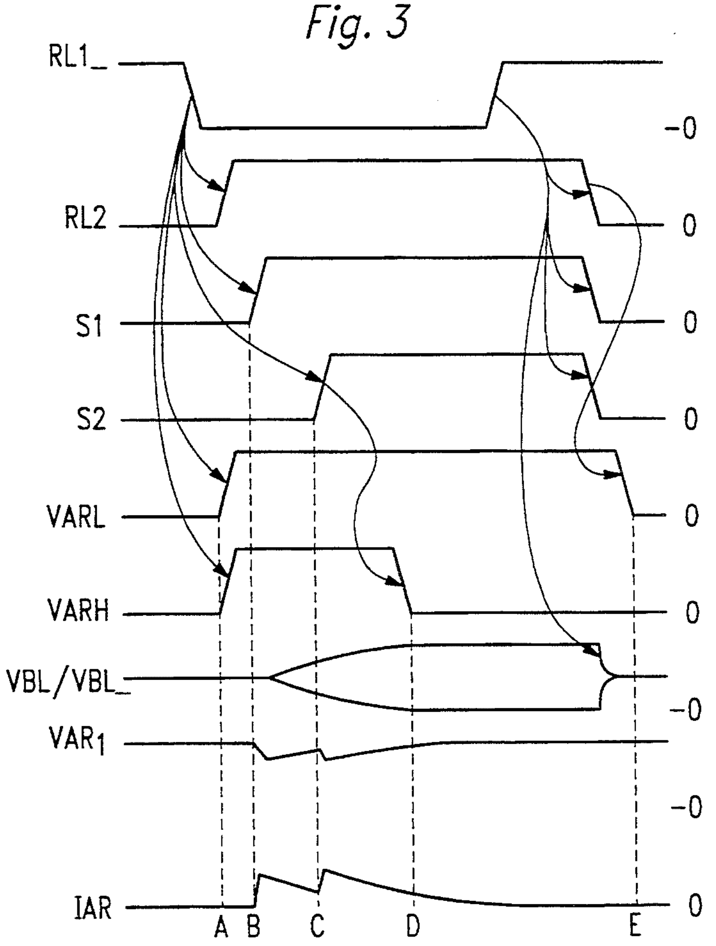
FIG. 4 is a timing diagram relating to a power supply regulator circuit as in FIG. 3.

At time B of FIG. 4, sense amplifiers 42 (FIG. 3) are activated by sense clock signal S1, and array current IAR abruptly increases. The increase in array current IAR causes array power supply sample voltage $VAR_1$ to decrease with respect to VREF, so N-channel transistor 142 becomes more conductive than N-channel transistor 138. The difference in conductivity causes an increase in gate voltage and a corresponding decrease in conductivity of P-channel transistor 136. The decrease in conductivity of P-channel transistor 136 and corresponding increase in conductivity of N-channel transistor 142 results in a decrease in comparator output voltage at terminal 144. The decrease in voltage at terminal 144 increases the gate-to-source voltage of P-channel drive transistor 148 so that it becomes more conductive and increases power supply voltage $VAR_0$. At time C, sense clock signal S2 increases the rate of amplification of sense amplifiers 42 (FIG. 3) and causes another increase in array current IAR. The increase in array current IAR causes array power supply sample voltage $VAR_1$ to decrease, and power supply voltage $VAR_0$ is corrected again in the same manner. The response time of the comparator and the rate for correcting power supply voltage $VAR_0$ is determined by current flow from the gate capacitance of P-channel drive transistor 148, through N-channel transistor 142, and through the parallel combination of N-channel transistors 158 and 158. The width and resulting gate capacitance of P-channel drive transistor 148 are determined by the current required by power supply voltage $VAR_0$. N-channel transistor 142 is typically much larger than either of N-channel transistors 156 and 158. Thus, the combined conductivity of N-channel transistors 158 and 158 determines the response time of the comparator and the rate for correcting power supply voltage $VAR_0$ as shown in FIG. 2. However, this combined conductivity of N-channel transistors 156 and 158 substantially increases quiescent power consumed by the comparator.

At time D of FIG. 4, sense amplifiers 42 (FIG. 3) have completed a substantial portion of amplification and there will be no more abrupt increases in array current IAR for the remainder of the active cycle. Array control signal VARH goes inactive (low) and turns off N-channel transistor 158, thereby substantially reducing the power consumed by the comparator for the duration of the active cycle. The corresponding reduction in comparator response time and the rate for correcting power supply voltage $VAR_0$ has no adverse effect on circuit operation for the duration of the active cycle. The active cycle is terminated by RL1_ going inactive (high). Bitlines are equalized and precharged to an intermediate bitline reference voltage. Most of the precharge current for the low bitline voltage VBL_ is derived from charge sharing with the high bitline voltage VBL so bitline precharge does not produce a significant increase in array current IAR. Thus, it is highly advantageous to use the combined conductivity of N-channel transistors 156 and 158 when response time of the comparator and the rate for correcting power supply voltage $VAR_0$ are essential to circuit operation. It is also highly advantageous to use the reduced conductivity of N-channel transistor 156 alone to reduce quiescent power when slower response time of the comparator and the rate for correcting power supply voltage $VAR_0$ provide acceptable circuit operation.

At time E of FIG. 4, array control signal VARL goes inactive (low) and N-channel transistors 156 and 154 are turned off, and comparator current is thereby eliminated. P-channel transistor 146 is turned on and shunts the gate and source terminals of P-channel drive transistor 148 so that it is turned off. Array power supply voltage $VAR_0$ is then maintained for the duration of the precharge cycle by standby array regulator 28 (FIG. 3).

Although the described embodiment of this invention accomplishes the regulation of an array power supply by means of a comparator and drive circuit, it is to be understood that there are other alternatives. For example, referring now to FIG. 8, differential input signals might be reversed by connecting reference voltage VREF to the gate of N-channel transistor 138 and connecting power supply sample voltage $VAR_1$ to the gate of N-channel transistor 142 so that power supply voltage $VAR_0$ could be driven directly from comparator output terminal 144. Alternatively, the regulator circuit might be used for a power supply for logic gates in peripheral circuits rather than for the array power supply. The regulator rate for correcting power supply voltage and the regulator power consumption might be determined by activation of row factors, column factors, or other high-current events. The number of control signals and the number of current source transistors could be increased appropriately with an increasing number of high-current events.

Although the invention has been described in detail with reference to its preferred embodiment, it is to be understood that this description is by way of example only and is not to be construed in a limiting sense. It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit for regulating a power supply voltage, the circuit comprising:

a regulator circuit for correcting the power supply voltage at a rate which varies with the regulator circuit power consumption;

means, responsive to a first control signal having first and second states. for setting a first rate of correcting the power supply voltage in response to the first state of the first control signal and for setting a second rate of correcting the power supply voltage in response to the second state of the first control signal; and means, responsive to a second control signal, for setting a third rate of correcting the power supply voltage, the second control signal corresponding to a selected period of operation of a device, the device imposing a greater load on the power supply during the selected period of operation than during other periods of operation.

2. A circuit, as in claim 1, wherein the device produces at least one of the control signals for setting at least one of the rates of correcting the power supply voltage.

3. A circuit, as in claim 1, wherein the second control signal has a first transition corresponding to a beginning of the selected period and a second transition corresponding to an end of the selected period.

4. A circuit, as in claim 1, which further comprises:

a first input terminal for receiving a reference voltage; and a second input terminal for receiving a power supply sample voltage which varies directly with the power supply voltage, wherein the regulator circuit correction of the power supply voltage varies in response to a difference between the reference voltage and the power supply sample voltage.

5. A circuit, as in claim 4, wherein the power supply sample voltage is a fraction of the power supply voltage.

6. A circuit, as in claim 1, wherein the regulator circuit further comprises:

a comparator circuit for producing a correction signal at a rate varying with power consumption of the comparator circuit; and a drive circuit, responsive to the correction signal, for correcting the power supply voltage.

7. A circuit, as in claim 1, wherein a first transition of the second control signal corresponds to a beginning of the selected period and a second transition of another control signal corresponds to an end of the selected period.

8. A circuit, as in claim 1, wherein the first state corresponds to a precharge cycle and the second state corresponds to an active cycle.

9. A circuit, as in claim 8, wherein the selected period corresponds to a high-current event of the device.

10. A circuit, as in claim 8, wherein the selected period corresponds to a sensing operation of the device.

11. A circuit, as in claim 1, wherein the first state corresponds to a standby mode of the device and the second state corresponds to an active mode of the device.

12. A circuit, as in claim 11, wherein the selected period corresponds to a high-current event of the device.

13. A method of regulating a power supply voltage, the method including the steps of:

correcting the power supply voltage at a rate which varies with power consumption of a regulator circuit;

applying the power supply voltage to a device;

producing a first state of a first control signal for setting a first rate of correcting the power supply voltage;

producing a second state of the first control signal for setting a second rate of correcting the power supply voltage;

producing a second control signal at a selected period of operation of the device for setting a third rate of correcting the power supply voltage; and imposing a greater load on the power supply by the device during the selected period of operation than during other periods of operation.

14. A method, as in claim 13, further including the steps of:

producing a reference voltage;

producing a power supply sample voltage;

comparing the reference voltage to the power supply sample voltage, the power supply sample voltage varying with the power supply voltage; and correcting the power supply voltage according to a difference between the reference voltage and the power supply sample voltage.

* * * * *